(12) United States Patent
Ikeda

(10) Patent No.: US 7,399,701 B2
(45) Date of Patent: Jul. 15, 2008

(54) SEMICONDUCTOR DEVICE MANUFACTURING METHOD INCLUDING FORMING A METAL SILICIDE LAYER ON AN INDIUM-CONTAINING LAYER

(75) Inventor: Noriaki Ikeda, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/417,044

(22) Filed: May 4, 2006

(65) Prior Publication Data

US 2006/0267199 A1 Nov. 30, 2006

(30) Foreign Application Priority Data

May 9, 2005 (JP) ............................. 2005-136726

(51) Int. Cl.
*H01L 21/4763* (2006.01)
(52) U.S. Cl. ................ 438/649; 438/655; 257/E21.165
(58) Field of Classification Search ................. 257/751, 257/754, 757, E21.165, E21.507; 438/649, 438/653, 655
See application file for complete search history.

(56) References Cited

U.S. PATENT DOCUMENTS 5,250,467 A * 10/1993 Somekh et al. ............. 438/643
5,369,055 A * 11/1994 Chung ........................ 438/533
5,821,147 A    10/1998 Kizilyalli
6,190,911 B1 *  2/2001 Gofuku ...................... 435/365
6,281,556 B1    8/2001 Gerritsen et al.
6,686,629 B1    2/2004 Assaderaghi et al.
7,211,516 B2 *  5/2007 Chen et al. .................. 438/682
2003/0207569 A1 * 11/2003 Gerritsen et al. ............ 438/683

FOREIGN PATENT DOCUMENTS

| JP | 64-25410     | 1/1989  |
| JP | 2002-368212 A | 12/2002 |
| TW | 480649       | 3/2002  |

OTHER PUBLICATIONS

Taiwanese Office Action issued in Taiwanese Patent Application No. TW 095116097, dated May 5, 2008.

* cited by examiner

*Primary Examiner*—Tuan N. Quach
(74) *Attorney, Agent, or Firm*—McDermott Will & Emery LLP

(57) ABSTRACT

The present invention provides a semiconductor device manufacturing method of a semiconductor device having a contact plug, in which a contact hole formed by a surface portion of a high-concentration N-type diffusion layer formed on a semiconductor silicon substrate surface and an interlayer insulating film is implanted with indium ions at an energy ranging from 30 to 120 keV and an implantation amount ranging from $1.0 \times 10^{13}/cm^2$ to $5.0 \times 10^{14}/cm^2$ to grow an indium-containing layer on the surface portion of the high-concentration N-type diffusion layer at the bottom of the contact hole.

8 Claims, 6 Drawing Sheets

PRIOR ART

SEMICONDUCTOR DEVICE MANUFACTURING METHOD INCLUDING FORMING A METAL SILICIDE LAYER ON AN INDIUM-CONTAINING LAYER

BACKGROUND OF THE INVENTION

1. Field of the Invention

The present invention relates to a semiconductor device manufacturing method, and particularly to a method of manufacturing a semiconductor device having a contact plug.

2. Related Art

In a semiconductor device, a semiconductor silicon substrate and an upper wiring layer are generally connected by use of a contact plug.

Here, a conventional method of manufacturing a semiconductor device is described with reference to FIGS. 1A through 1E.

As shown in FIG. 1A, an interlayer insulating film 2 made of $SiO_2$ or the like is formed on a semiconductor substrate 1.

Then, a photoresist layer (not shown) is formed at a given position on the aforementioned interlayer insulating film 2, and this photoresist layer is used as a mask in a well-known dry etching process to form a contact hole 3 shown in FIG. 1B.

Next, as shown in FIG. 1C, a sputtering process is performed to form a titanium layer 4 on the surface of the contact hole 3. Then, annealing treatment is performed in an atmosphere of $N_2$ gas thereby to make the titanium layer 4 become a barrier layer 6 of TiN as illustrated in FIG. 1D. At this point, a metal silicide layer 5 of $TiSi_2$ is formed on the semiconductor silicon substrate 1 under the bottom of the contact hole 3.

Then, provided on the aforementioned contact hole 3 is a conducting layer comprised of tungsten, polysilicon containing impurities or the like to form a contact plug 7 as shown in FIG. 1E.

The resistance of the thus formed contact plug is preferably lower so as to reduce power consumption of the semiconductor device. For the purpose of reducing the resistance of the contact plug and the like, there is known a method of forming a $TiSi_2$ layer at the bottom of the aforementioned contact hole.

Meanwhile, there is also known a method of manufacturing an insulated gate field effect transistor, as shown in FIGS. 2A and 2B, by implanting the whole surface of the N-type diffusion layer of the semiconductor silicon substrate with indium ions.

This method is explained below:

First, as shown in FIG. 2A, a device separation insulating region 13 and an insulating film 14 are formed on the semiconductor silicon substrate. Then, phosphorus ions and boron ions are implanted into the semiconductor silicon substrate and thereby, a P-type well 8 and an N-type well 9 are formed in the semiconductor silicon substrate.

This is followed by selectively implanting boron ions into the P-type well 8 and phosphorus ions into the N-type well 9. Then, a P-type high-concentration well layer 10 and an N-type high-concentration well layer 11 are formed on the P-type well 8 and the N-type well 9, respectively.

After that, indium ions are implanted into the whole surface of the P-type well 8 and the N-type well 9 and thereby, an indium-containing layer 12 is formed on the semiconductor silicon substrate.

Further, as shown in FIG. 2B, arsenic ions are selectively implanted into the P-type high-concentration well layer 10 with a gate electrode structure 20, which is provided on the semiconductor silicon substrate, used as an implantation blocking mask, and thereby high-concentration N-type diffusion layers 15 and 16 are formed.

Likewise, $BF_2$ ions are selectively implanted into the N-type high-concentration well layer 11 and thereby high-concentration P-type diffusion layers 17 and 18 are formed.

Here, the high-concentration N-type diffusion layers 15 and 16 and the high-concentration P-type diffusion layers 17 and 18 correspond to a source/drain structure of the insulated gate field effect transistor.

The just-described method of manufacturing a semiconductor device having an indium-containing layer, is proposed in Japanese Patent Application Publication No. 2002-368212.

BRIEF SUMMARY OF THE INVENTION

However, with downsizing and high integration of semiconductor devices in recent years, as the diameter of the contact hole is smaller, only the $TiSi_2$ layer grown at the bottom of the contact hole is not enough to prevent increase in the resistance value of the contact plug.

Further, the aforementioned method of implanting indium ions into the whole surface of the N-type high-concentration diffusion layer presents a problem that the indium ions, which are larger in atom radius than silicon, may cause silicon crystal defects in the semiconductor silicon substrate. Accordingly, it is required to set the implantation amount of indium ions at $5 \times 10^{11}/cm^2$ or less.

The present invention has an object to provide a semiconductor device manufacturing method of a semiconductor device having a contact plug of excellent resistance.

As a result of keen examination to overcome the aforementioned problem, the inventor of the present invention have found that a semiconductor device having a contact plug of excellent resistance can be achieved by the semiconductor device manufacturing method comprising: forming a contact hole which reaches a high-concentration N-type diffusion layer provided on a surface of the semiconductor silicon substrate; and implanting indium ions of opposite conductivity type to the N-type via the contact hole, in which an implantation amount of the indium ions falls within a range from $1.0 \times 10^{13}/cm^2$ to $5.0 \times 10^{14}/cm^2$, and completed the present invention successfully.

Specifically, the present invention provides:

[1] a semiconductor device manufacturing method comprising the steps of:

(1) forming a high-concentration N-type diffusion layer on a surface of a semiconductor silicon substrate;

(2) forming an interlayer insulating film on the semiconductor silicon substrate with the high-concentration N-type diffusion layer;

(3) etching a predetermined position of the interlayer insulating film to form a contact hole reaching the high-concentration N-type diffusion layer;

(4) implanting a surface portion of the high-concentration N-type diffusion layer with indium ions at an energy ranging from 30 to 120 keV and an implantation amount ranging from $1.0 \times 10^{13}/cm^2$ to $5.0 \times 10^{14}/cm^2$ via the contact hole to grow an indium-containing layer at a bottom of the contact hole;

(5) forming a metal silicide layer on the indium-containing layer formed at the bottom of the contact hole;

(6) forming a barrier layer on an upper surface of the interlayer insulating film and an inner surface of the contact hole other than the bottom of the contact hole; and (7) forming a contact plug in the contact hole.

The present invention further provides:

[2] a semiconductor device manufacturing method according to the above-mentioned item [1], in which the metal silicide layer is of at least one selected from the group consisting of $TiSi_2$, $CoSi_2$, $TaSi_2$, $PtSi_2$ and $NiSi_2$.

The present invention further provides:

[3] a semiconductor device manufacturing method according to the above-mentioned item [1] or [2], in which an acceleration energy for implantation of the indium ions ranges from 40 to 100 keV.

The present invention further provides:

[4] a semiconductor device manufacturing method according to any one of the above-mentioned items [1] to [3], in which the implantation amount ranges from $4.0\times10^{13}/cm^2$ to $1.0\times10^{14}/cm^2$.

The present invention further provides:

[5] a semiconductor device manufactured by the semiconductor device manufacturing method according to any one of the above-mentioned items [1] to [4].

The present invention further provides:

[6] a semiconductor device comprising:

a semiconductor silicon substrate;

a high-concentration N-type diffusion layer provided on a surface of said semiconductor silicon substrate;

an indium-containing layer provided in said high-concentration N-type diffusion layer;

an interlayer insulating film provided at a predetermined position on said semiconductor silicon substrate;

a barrier layer provided in contact with an inner surface of a contact hole defined by the surface of said semiconductor silicon substrate and said interlayer insulating film and with said interlayer insulating film;

a contact plug provided in contact with said barrier layer; and a metal silicide layer provided at a boundary region between said indium-containing layer and said barrier layer, in which indium concentration of said indium-containing layer ranges from $5.0\times10^{18}/cm^3$ to $5.0\times10^{19}/cm^3$.

The present invention further provides:

[7] a semiconductor device according to the above-mentioned item [5] or [6], comprising an N channel insulated gate field effect transistor structure.

The semiconductor device manufacturing method of the present invention makes it possible to provide a semiconductor device having a contact plug of excellent resistance.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

With reference to the drawings, a semiconductor device obtained by the present invention will be described below.

Figure 3:
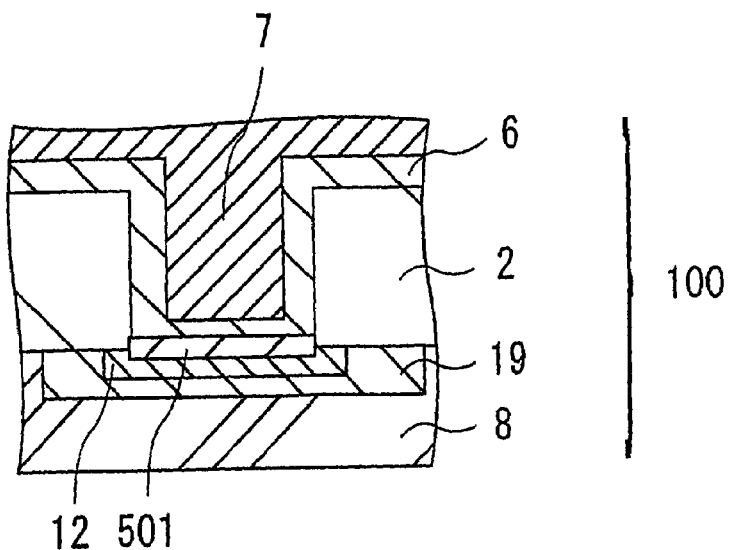
FIG. 3 is a cross sectional view partially illustrating substantial parts of a semiconductor device obtained by the present invention.

FIG. 3 is a cross sectional view partially illustrating substantial parts of a configuration of the semiconductor device according to an embodiment of the present invention.

The semiconductor device 100 is a semiconductor device having an N channel insulated gate field effect transistor (N channel MOS) structure. Provided on a high-concentration N-type diffusion layer 19 of this semiconductor device 100 is a contact plug, of which an example structure is illustrated in FIG. 3.

As shown in FIG. 3, the high-concentration N-type diffusion layer 19 is provided in a P-type well 8 provided in the semiconductor silicon substrate 1.

Figure 1A:
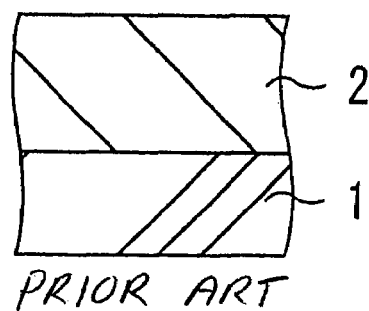
FIGS. 1A to 1E are cross sectional views each partially illustrating substantial parts for explaining a method of manufacturing a contact plug.
Figure 1B:
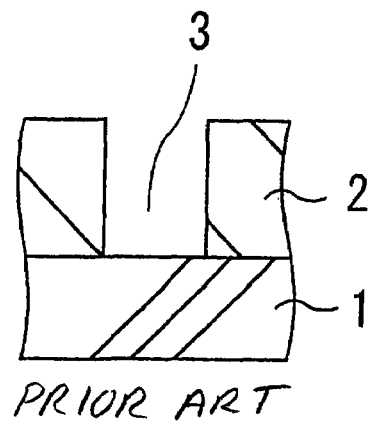
Figure 1C:
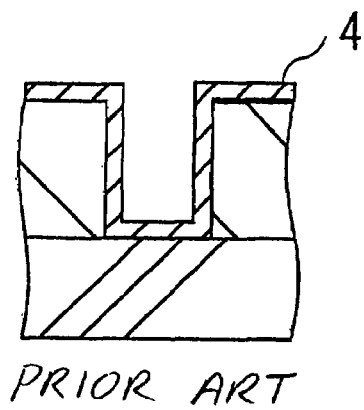
Figure 1D:
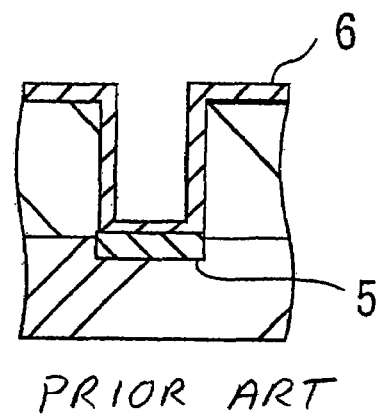
Figure 1E:
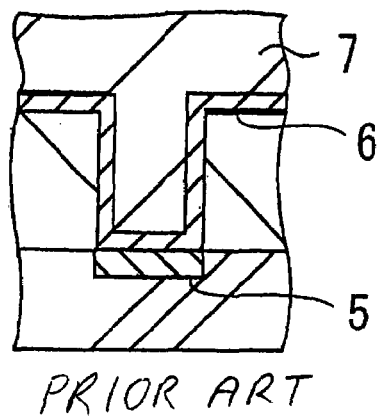
Figure 2A:
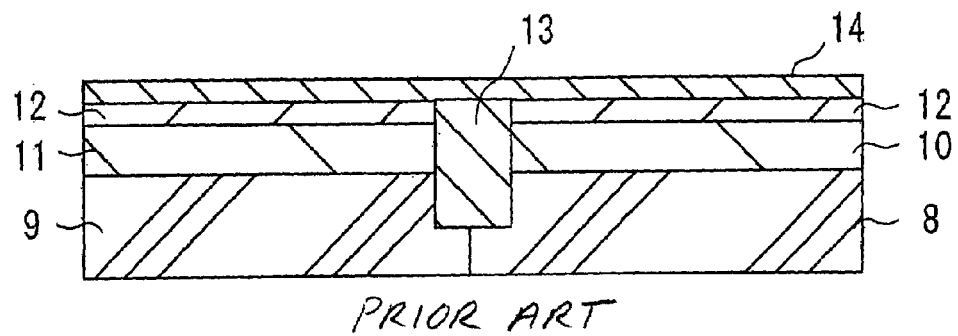
FIGS. 2A and 2B are cross sectional views each partially illustrating substantial parts for explaining conventional method of manufacturing an insulated gate field effect transistor.
Figure 2B:
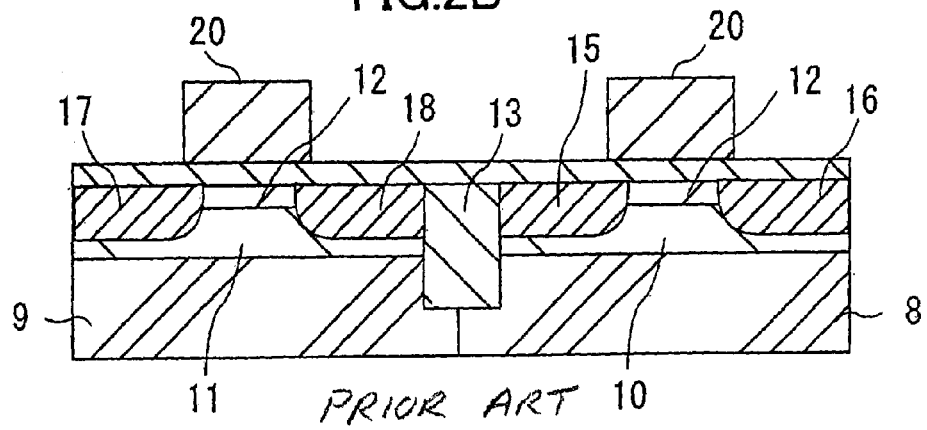

As is not specifically illustrated, but as is the case with FIGS. 2A and 2B explained above, a P-type high-concentration well layer may be provided on a semiconductor silicon substrate surface of the P-type well 8.

The high-concentration N-type diffusion layer 19 corresponds to a source/drain structure of the semiconductor device 100. Provided with this source/drain structure, a gate electrode structure (not shown) and the like the semiconductor device serves as N channel MOS.

Further, the semiconductor device 100 has a contact plug 7 as shown in FIG. 3.

This contact plug 7 is generally composed of at least one of tungsten, polysilicon containing impurities, and so on.

The above-mentioned impurities include, for example, phosphorus and boron.

The contact plug 7 is provided on an interlayer insulating film 2 and the semiconductor silicon substrate 1 via a barrier layer 6.

The interlayer insulating film 2 is composed of, for example, $SiO_2$.

Further, the barrier layer 6 is composed of, for example, at least one of TiN, TaN and so on.

For ease of handling, the barrier layer 6 is preferably composed of TiN.

Besides, the barrier layer 6 is provided in contact with a portion called "contact hole" which is defined by the interlayer insulating film 2 and the semiconductor silicon substrate 1.

In the present invention, the depth of the contact hole preferably ranges from 400 to 1000 nm for ease of handling.

In addition, the diameter of the bottom of the contact hole, i.e. a portion of the contact hole corresponding to the surface of the semiconductor silicon substrate 1, preferably ranges from 50 to 260 nm. The diameter of the upper portion of the contact hole, i.e. a portion of the contact hole almost in the same plane as the upper surface of the interlayer insulating film 2 preferably ranges from 100 to 300 nm.

Further, in the semiconductor silicon substrate 1 an indium-containing layer 12 is formed in the high-concentration N-type diffusion layer 19. The indium-containing layer 12 is a layer formed at the surface of the semiconductor silicon substrate 1.

In order to reduce the resistance of the contact plug 7, the indium-containing layer 12 has a depth of 25 nm or more, or preferably 50 nm, from the surface of the semiconductor silicon substrate 1.

The concentration of indium contained in the indium-containing layer 12 preferably ranges from $5.0 \times 10^{18}$ to $5.0 \times 10^{19}/cm^3$, or more preferably from $5.0 \times 10^{18}$ to $1.0 \times 10^{19}/cm^3$.

Further, formed at a boundary region between the indium-containing layer 12 and the barrier layer 6 is a metal silicide compound layer 501.

Such a metal silicide compound layer 501 is composed of at least one of $TiSi_2$, $CoSi_2$, $TaSi_2$, $PtSi_2$, $NiSi_2$ and the like.

The metal silicide compound layer 501 is preferably of at least one selected from the group consisting of $TiSi_2$, $CoSi_2$ and $NiSi_2$, or more preferably of $TiSi_2$.

EXAMPLE 1

Next description is made in detail about the manufacturing method of the present invention based on the following example with reference to the drawings. Here, the present invention is not limited to the embodiment described in the following example.

Figure 4:
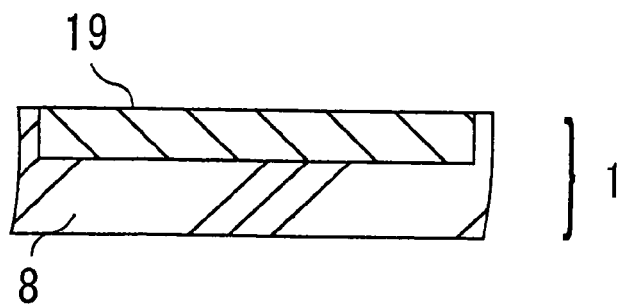
FIG. 4 is a cross sectional view partially illustrating substantial parts of a semiconductor silicon substrate for explaining the manufacturing method of the present invention.

The manufacturing method of the present invention includes a step (1) of forming a high-concentration N-type diffusion layer 19 at a surface of the semiconductor silicon substrate 1 as illustrated in FIG. 4.

The semiconductor silicon substrate 1 contained B ions at a concentration ranging from $10^{16}/cm^3$ to $10^{18}/cm^3$ and the P-type well 8 was formed therein.

A predetermined position of the P-type well 8 was implanted once with As ions at an energy of 10 keV and an implantation amount of $2.8 \times 10^{14}$ $cm^2$ from the vertical direction relative to the semiconductor silicon substrate 1.

This was followed by implanting once P ions at an energy of 18 keV and an implantation amount of $3.0 \times 10^{13}$ $cm^2$ from the vertical direction relative to the semiconductor silicon substrate 1. Then, As ions were further implanted at an energy of 35 keV and an implantation amount of $4.0 \times 10^{15}$ $cm^2$ from the vertical direction relative to the semiconductor silicon substrate 1.

Further, these ions were diffused at temperatures ranging from 950 to 1000° C. thereby to form the high-concentration N-type diffusion layer 19.

The high-concentration N-type diffusion layer 19 at the point of ion diffusion had a depth ranging from 100 to 150 nm from the surface of the semiconductor silicon substrate 1.

The high-concentration N-type diffusion layer 19 corresponds to a source/drain structure of the N channel MOS semiconductor device obtained by the manufacturing method of the present invention. Provided with this source/drain structure, a gate electrode structure (not shown) and the like, the semiconductor device obtained by the manufacturing method of the present invention serves as N channel MOS.

Figure 5:
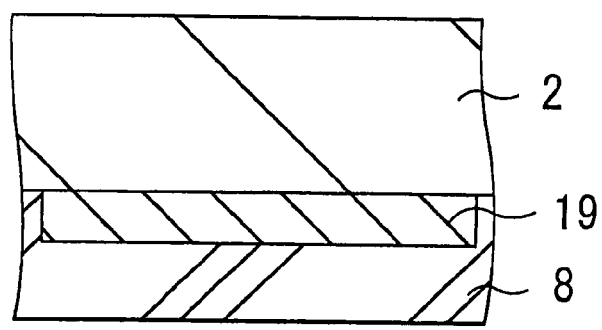
FIG. 5 is a partial cross sectional view illustrating an interlayer insulating film formed on the semiconductor silicon substrate for explaining the manufacturing method of the present invention.

Besides, the manufacturing method of the present invention includes a step (2) of forming an interlayer insulating film 2 on the semiconductor silicon substrate 1 provided with the high-concentration N-type diffusion layer 19, as illustrated in FIG. 5.

The interlayer insulating film 2 is formed by a well known method and for example, may be formed by using $SiO_2$, BPSG (Boron Phosphorous Silicate Glass) or the like.

Figure 6:
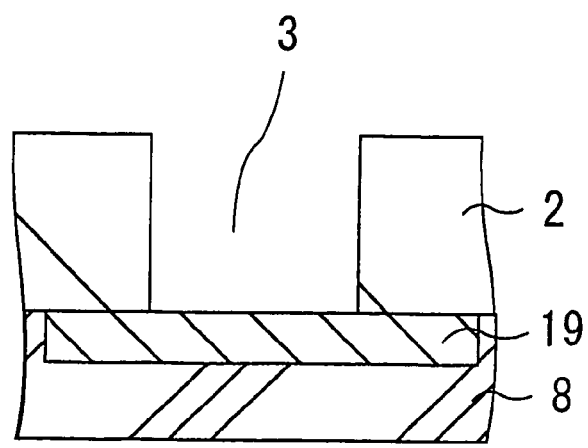
FIG. 6 is a partial cross sectional view illustrating a contact hole formed in the interlayer insulating film for explaining the manufacturing method of the present invention.

The manufacturing method of the present invention includes a step (3) of performing etching on a predetermined portion of the interlayer insulating film 2 to form a contact hole which reaches the high-concentration N-type diffusion layer 19, as illustrated in FIG. 6.

A photoresist layer (not shown) was formed at a predetermined portion on the interlayer insulating film 2 and this photoresist layer was used as a mask to perform well-known etching processing such as dry etching thereby to form the contact hole 3 illustrated in FIG. 6.

The thus-formed contact hole had a depth ranging from 550 to 750 nm.

In addition, the diameter of the bottom of the contact hole 3, i.e. a portion of the contact hole 3 corresponding to a surface of the semiconductor silicon substrate 1, ranged from 60 to 160 nm. The diameter of the upper portion of the contact hole, i.e. a portion of the contact hole almost in the same plane as the upper surface of the interlayer insulating film 2 ranged from 110 to 190 nm.

Further, the manufacturing method of the present invention includes a step (4) of implanting the surface of the high-concentration N-type diffusion layer via the contact hole with indium ions at an energy ranging from 30 to 120 keV and an implantation amount ranging from $1.0 \times 10^{13}$ to $5.0 \times 10^{14}/cm^2$ to form an indium-containing layer 12 on the bottom of the contact hole.

This processing of indium ion implantation makes the indium-containing layer 12 grow over the high-concentration N-type diffusion layer 19 and thereby it becomes possible to reduce the resistance of the contact plug.

Here, prior to indium ion implantation, phosphorus ions were implanted to the surface of the high-concentration N-type diffusion layer via the contact hole at an energy ranging from 5 to 10 keV and an implantation amount ranging from $1.0 \times 10^{13}$ to $3.0 \times 10^{13}/cm^2$.

After indium ion implantation, the semiconductor silicon substrate 1 was heated for annealing with use of a lump light source in a nitrogen atmosphere at the temperature of 700° C. for 60 seconds thereby to form the indium-containing layer 12.

Further, the manufacturing method of the present invention includes a step (5) of forming a metal silicide layer on the indium-containing layer 12 formed at the bottom of the contact hole 3 and a step (6) of forming a barrier layer 6 on the upper surface of the interlayer insulating film 2 and the inner surface of the contact hole 3 other than the bottom of the contact hole.

Figure 8:
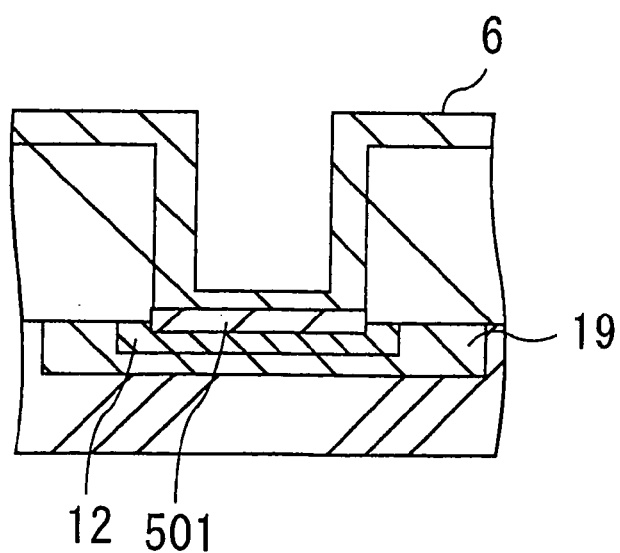
FIG. 8 is a partial cross sectional view illustrating a barrier layer formed on the contact hole for explaining the manufacturing method of the present invention.

$TiCl_4$ gas at a flow rate of 12 $cm^3/m$ was made to react with $H_2$ gas at a flow rate of 4000 $cm^3/m$ and Ar gas at a flow rate of 1600 $cm^3/m$ at a temperature of 650° C., and as a result of CVD, the metal silicide layer 501 was formed of $TiSi_2$ with a film thickness of 10 nm, which is illustrated in FIG. 8.

Then, $TiCl_4$ gas at a flow rate of 63 $cm^3/m$ was made to react with $NH_3$ gas at a flow rate of 240 $cm^3/m$ and $N_2$ gas at a flow rate of 5500 $cm^3/m$ at a temperature of 650° C., and as a result of CVD, a barrier layer 6 of TiN with a film thickness of 12.5 nm was deposited on the metal silicide layer 501 of TiSi$_2$.

In this example, the semiconductor device was manufactured having the metal silicide layer 501 of TiSi$_2$ as described above. However, the semiconductor device can be manufactured to have a metal silicide layer of CoSi$_2$, which method is described below.

Figure 7:
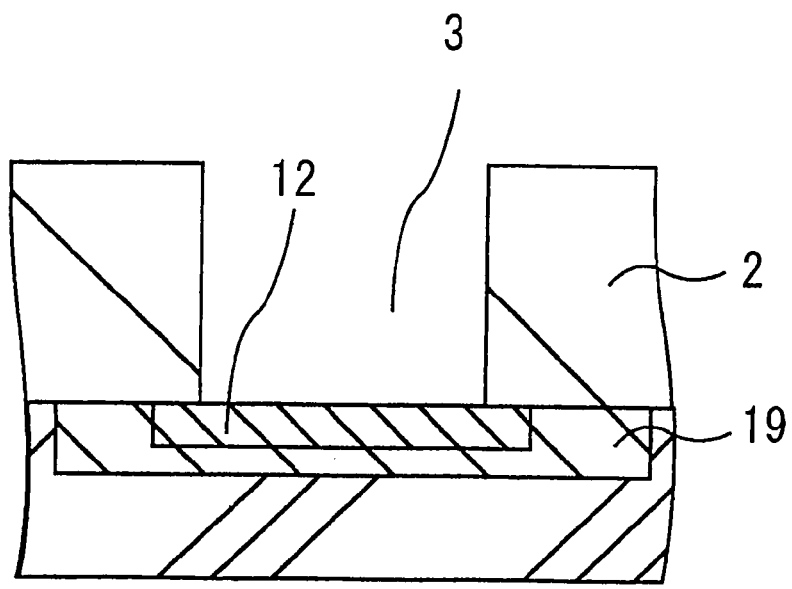
FIG. 7 is a partial cross sectional view illustrating an indium-containing layer formed on the semiconductor silicon substrate for explaining the manufacturing method of the present invention.
Figure 9:
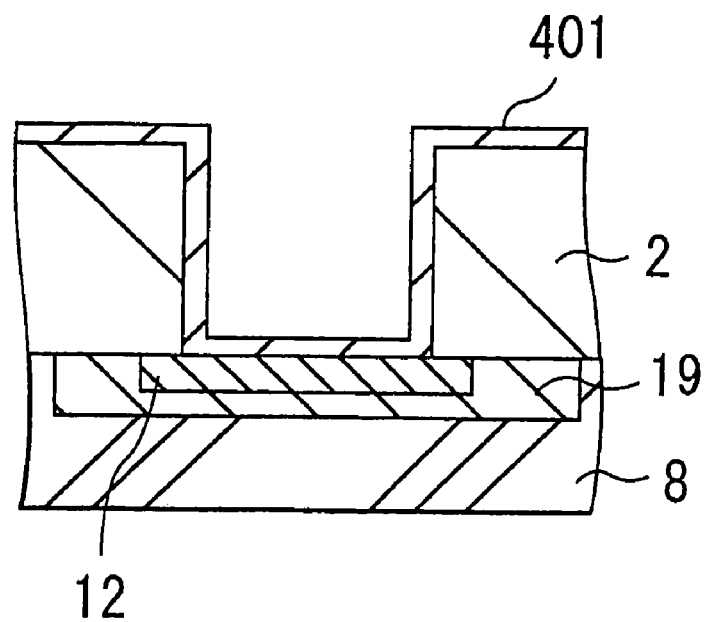
FIG. 9 is a partial cross sectional view illustrating a cobalt layer formed on the contact hole for explaining a modified example of the present invention.
Figure 10:
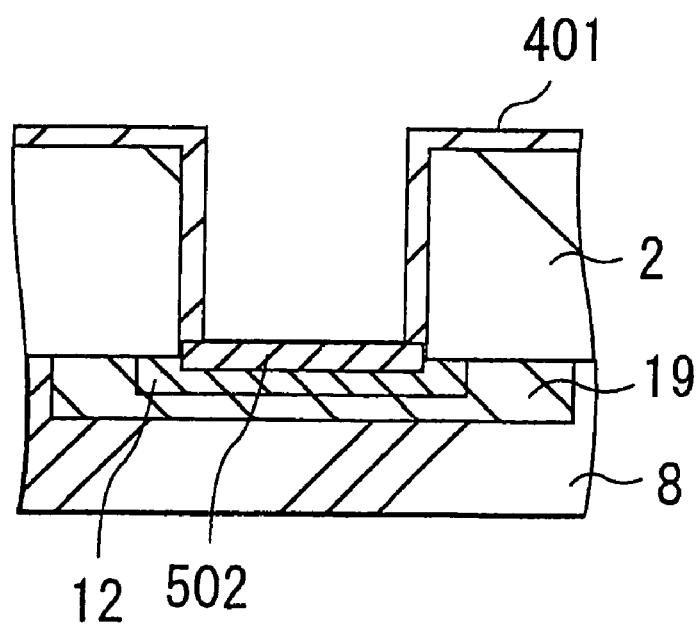
FIG. 10 is a partial cross sectional view illustrating a metal silicide layer formed for explaining the modified example of the present invention.

First, on the inner surface of the contact hole 3 and the upper surface of the interlayer insulating film 2 shown in FIG. 7, a sputtering method or the like is used to deposit a cobalt layer 401 which is illustrated in FIG. 9. There is no particular limitation in the sputtering method and it can be performed by any well-known technique.

This is followed by heating treatment and whereby the cobalt layer 401 at the bottom of the contact hole 3 is made react with the silicon in the semiconductor silicon substrate to deposit a metal silicide layer 502 of CoSi$_2$.

Figure 11:
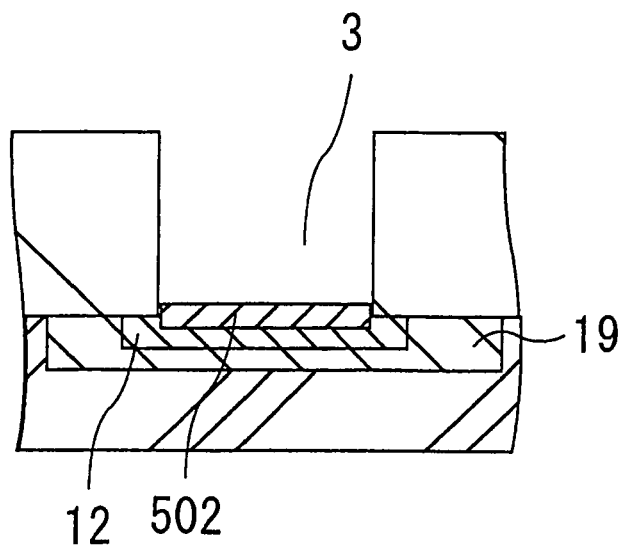
FIG. 11 is a partial cross sectional view illustrating the contact hole with the cobalt layer removed from for explaining the modified example of the present invention.
Figure 12:
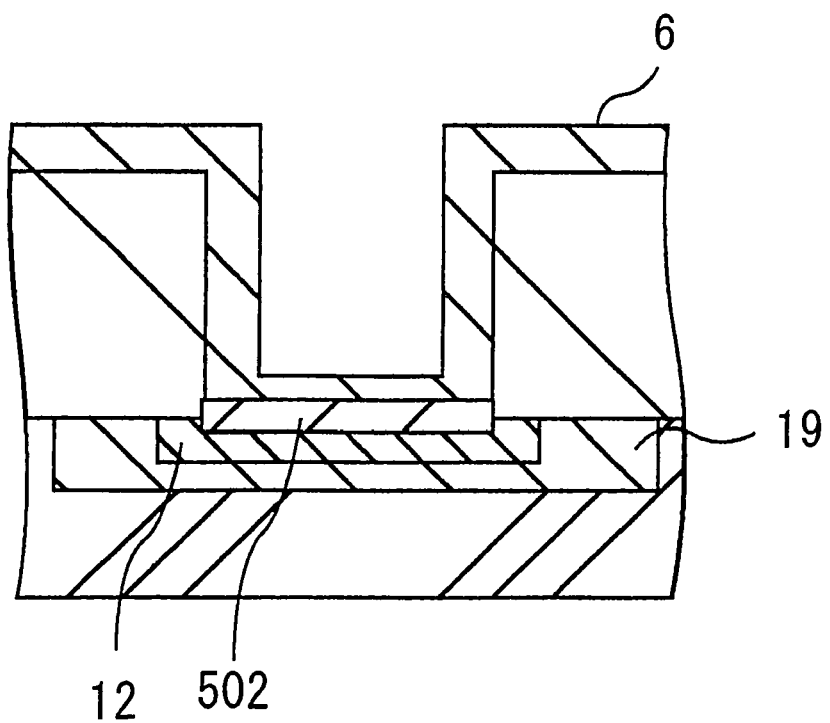
FIG. 12 is a partial cross sectional view illustrating a barrier layer formed on the contact hole for explaining the modified example of the present invention.

After removing the cobalt layer 401 by any well-known method such as etching as illustrated in FIG. 11, a barrier layer 6 of TiN can be formed on the metal silicide layer 502 of CoSi$_2$ by the same method as described above, which is shown in FIG. 12.

Next, the manufacturing method of the present invention includes a step (7) of forming a contact plug 7 in the contact hole as illustrated in FIG. 3.

WF$_6$ gas at a flow rate of 340 cm$^3$/m was made to react with H$_2$ gas at a flow rate of 2200 cm$^3$/m, Ar gas at a flow rate of 4000 cm$^3$/m and N$_2$ gas at a flow rate of 200 cm$^3$/m at a temperature of 450° C. and as a result of CVD, the contact plug 7 of tungsten was formed.

After deposition of the contact plug, etching, CMP or other processing can be used to fix the shape of the contact plug 7.

After fixing the shape of the contact plug 7, the semiconductor device can be completed following a well-known method.

Thus, the manufacturing method including the above-described steps (1) through (7) makes it possible to obtain a semiconductor device.

The resistance value of the contact plug obtained in the above-described manufacturing method ranged from 360 to 420 Ω while the resistance value of the contact plug 7 when the indium-containing layer 12 was not provided ranged from 580 to 640 Ω.

In addition, in the above-described example 1, the acceleration energy of the indium ions was set at 60 keV, and the implantation amounts of the indium ions were compared between $1.0\times10^{13}$/cm$^2$ and $8.0\times10^{14}$/cm$^2$. Then, the resistance values of the contact plugs obtained in these were almost the same.

The present invention is not limited to the above described embodiments, and various variations and modifications may be possible without departing from the scope of the present invention.

This application is based on the Japanese Patent application No. 2005-136726 filed on May 9, 2005, entire content of which is expressly incorporated by reference herein.

What is claimed is:

1. A semiconductor device manufacturing method comprising the steps of:
   (1) forming a high-concentration N-type diffusion layer on a surface of a semiconductor silicon substrate;
   (2) forming an interlayer insulating film on the semiconductor silicon substrate with the high-concentration N-type diffusion layer;
   (3) etching a predetermined position of the interlayer insulating film to form a contact hole reaching the high-concentration N-type diffusion layer;
   (4) implanting a surface portion of the high-concentration N-type diffusion layer with indium ions at an energy ranging from 30 keV to 120 keV and an implantation amount ranging from $1.0\times10^{13}$/cm$^2$ to $5.0\times10^{14}$/cm$^2$ via the contact hole to grow an indium-containing layer at a bottom of the contact hole;
   (5) annealing the semiconductor substrate after implanting the indium ions;
   (6) depositing a metal by a chemical vapor deposition process at a temperature sufficient to expedite a reaction between the metal and the silicon substrate to form a metal silicide layer on the indium-containing layer formed at the bottom of the contact hole;
   7 forming a barrier layer on an upper surface of the interlayer insulating film and an inner surface of the contact hole; and
   8 forming a contact plug in the contact hole.

2. The semiconductor device manufacturing method according to claim 1, wherein the metal suicide layer is of at least one selected from the group consisting of TiSi$_2$, CoSi$_2$, TaSi$_2$, PtSi$_2$ and NiSi$_2$.

3. The semiconductor device manufacturing method according to claim 2, wherein an acceleration energy for implantation of the indium ions ranges from 40 keV to 100 keV.

4. The semiconductor device manufacturing method according to claim 3, wherein the implantation amount ranges from $4.0\times10^{13}$/cm$_2$ to $1.0\times10^{14}$/cm$_2$.

5. The semiconductor device manufacturing method according to claim 2, wherein the implantation amount ranges from $4.0\times10^{13}$/cm$^2$ to $1.0\times10^{14}$/cm$_2$.

6. The semiconductor device manufacturing method according to claim 1, wherein an acceleration energy for implantation of the indium ions ranges from 40 keV to 100 keV.

7. The semiconductor device manufacturing method according to claim 6, wherein the implantation amount ranges from $4.0\times10^{13}$/cm$_2$ to $1.0\times10^{14}$/cm$_2$.

8. The semiconductor device manufacturing method according to claim 1, wherein the implantation amount ranges from $4.0\times10^{13}$/cm$_2$ to $1.0\times10^{14}$/cm$_2$.

* * * * *